United States Patent [19]
Su et al.

[11] Patent Number: 6,001,731
[45] Date of Patent: *Dec. 14, 1999

[54] ISOLATION DIELECTRIC DEPOSITION IN MULTI-POLYSILICON CHEMICAL-MECHANICAL POLISHING PROCESS

[75] Inventors: Chung-Hui Su; Mong-Song Liang; Shou-Gwo Wuu; Chen-Jong Wang, all of Hsin-Chu, Taiwan

[73] Assignee: Taiwan Semiconductor Manufacturing Company Ltd., Hsin-Chui, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 08/682,457

[22] Filed: Jul. 17, 1996

[51] Int. Cl.⁶ .................................................. H01L 21/4763
[52] U.S. Cl. .......................................... 438/633; 438/693
[58] Field of Search ..................... 156/659.11; 438/626, 438/631, 633, 693

[56] References Cited

U.S. PATENT DOCUMENTS

| | | |
|---|---|---|
| 4,614,021 | 9/1986 | Hulseweh . |
| 5,395,801 | 3/1995 | Doan et al. ............................ 437/225 |
| 5,420,075 | 5/1995 | Homma et al. . |
| 5,677,239 | 10/1997 | Isobe . |

*Primary Examiner*—Richard Booth
*Attorney, Agent, or Firm*—George O. Saile; Stephen B. Ackerman

[57] ABSTRACT

A method for providing a chemical mechanical polishing planarization process for preventing multi-polysilicon and multi-metal level electrical shorts, which includes briefly the sequential processing steps of i) providing an insulating layer to a first thickness over a device wafer with non-planar surface topography; ii) chemical-mechanical polishing the first insulating layer; and iii) deposition of another polysilicon layer of second thickness to prevent the barely exposed or exposed underlying polysilicon from shorting to the next polysilicon or metal level of interconnects.

11 Claims, 2 Drawing Sheets

ISOLATION DIELECTRIC DEPOSITION IN MULTI-POLYSILICON CHEMICAL-MECHANICAL POLISHING PROCESS

BACKGROUND OF THE INVENTION (1) Field of the Invention

This invention relates specifically to chemical-mechanical polishing (CMP) methods used to planarize device wafers having multiple levels of polysilicon layers sandwiched between insulating layers.

(2) Background of the Invention & Description of Prior Art

In the development of the integrated circuits (IC), the industry is ever striving to improve performance by scaling down the device dimensions for high speed circuits. However, scaling down the device has arrived at a point that further scaling is less profitable due to the high risk of yield and reliability failures. Eventually, the down-sizing of the active device have become less expedient in improving the performance further, without exponentially increasing the cost of fabrication by the IC manufacturers. Thereby, the manufacturers of the IC industry seek other alternatives to increase the circuit speed and maximum functional density and complexity by improving the interconnects. The predominant method to circumvent the aforementioned limitations involves the adaptation of vertical stacking of integrated devices and interconnect wiring levels.

The switch to multilevel interconnection for performance advantage causes loss of topographical planarity. The resulting non-planar topography of the device wafer in turn creates problems in photolithography, etching, as well as electrical shorts and many other related problems. One of the current state-of-the-art methods to planarize the non-planar surface of device wafer is by the chemical-mechanical polishing (CMP) technique.

Doan & Meikle in U.S. Pat. No. 5,395,801 have described a method for planarizing a semiconductor wafer having non-planar topography by the deposition of a conformal layer of insulating material of a first thickness to the wafer. A CMP protective layer of different composition and thickness than the conformal insulating layer is deposited over the conformal layer. The CMP polishing of both protective and underlying conformal insulating layers is done with a single CMP step using a single CMP slurry and under conditions which in combination with the slurry removes the conformal layer material at a faster rate than the protective layer material, the protective layer upon outward exposure of conformal insulating layer in high topographical areas restricting material removal from low topographical areas during this CMP process. Doan & Meikle further described other alternatives to the aforementioned single slurry CMP process by using two or three CMP steps with respective CMP slurries and different selective polishing rates.

This invention will describe a CMP process to address the problems of multi-level polysilicon to polysilicon shorts due to conventional CMP planarization of the non-planar surface of semiconductor device wafer, by deposition of another insulating layer after the chemical-mechanical polishing before depositing the next polysilicon layer.

SUMMARY OF THE INVENTION

It is an object of this invention to provide a process to planarize semiconductor device wafers having several levels of interconnects, such as multi-level polysilicon layers sandwiched between the insulating layers.

It is another object of this invention to use the one step CMP polishing process with a single slurry as the planarization process.

It is still another object of this invention to prevent interlevel polysilicon to polysilicon shorts by depositing a second insulating layer after chemical-mechanical polishing and planarizing the first insulating layer.

In accordance with the present invention a process is described to planarize a non-planar semiconductor device wafer having multi-levels of polysilicon contacts and wirings. An insulating layer such as oxide from tetraethylorthosilicate source (TEOS) is deposited over a semiconductor wafer with non-planar topography surface. The semiconductor device wafer is then subjected to the chemical-mechanical polishing (CMP) processing using a single polishing slurry. Due to the non-uniform polishing rate at the high and low spots in the surface topography the resulting surfaces after CMP polishing invariably show that some of the surfaces of the polysilicon in the high topographical areas are exposed without insulating coverage. A second oxide material layer of sufficient thickness is deposited over the entire wafer to insure that the exposed polysilicon surfaces in the high topographical regions and edges are covered with this second insulating layers. Another level of polysilicon is deposited over this second insulating layer and patterned by the conventional photolithographic and dry or wet etching procedures.

BRIEF DESCRIPTION OF THE DRAWINGS

The object and other advantages of this invention are described in the preferred embodiments with reference to the following drawings.

DESCRIPTION OF THE PREFERRED EMBODIMENTS

The method of fabricating multi-level interconnect to prevent electrical shorts caused by CMP planarization of non-planar topographical surface of device wafer, will now be described.

This invention can be applied as in the fabrication of static-random-access memory (SRAM) or other metal-oxide-silicon (MOS) or complimentary metal-oxide-silicon (CMOS) circuits where multi-level polysilicon interconnects are being manufactured in the IC industry, therefore only the specific areas unique to the understanding this invention will be covered in detail.

Figure 1:
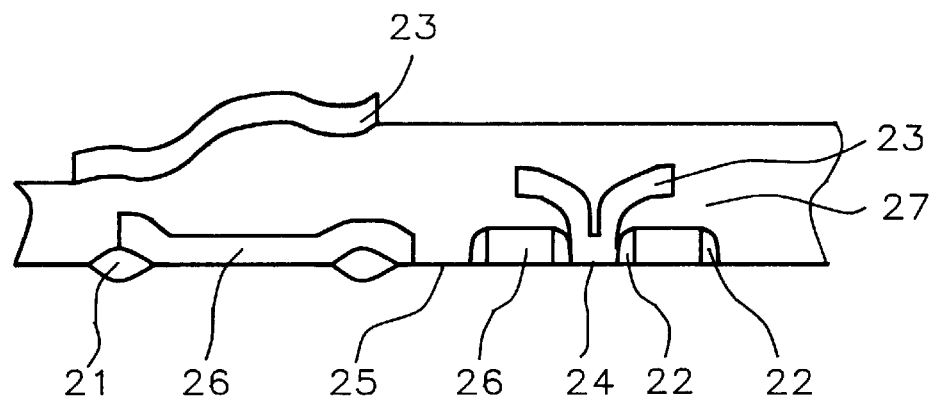
FIG. 1 is a schematic cross section of a semiconductor IC device processed at a stage prior to polysilicon contact deposition.

FIG. 1 schematically shows a typical MOS device prior to the deposition of the self-aligned-contact polysilicon, 23. The MOS devices are processed using a p-type, single crystalline silicon, with a (100) crystallographic orientation.

Thick field oxide (FOX) regions, 21, used for isolation purpose of various devices and device components are formed using an oxidation masking pattern composed of an overlying silicon nitride layer and an underlying silicon dioxide layer. This composite insulator mask is patterned using conventional photolithographic and reactive ion etching (RIE) techniques. After photoresist strip via plasma oxygen ashing and surface cleaning, a silicon dioxide is formed via an oxygen and steam thermal oxidation, at a temperature between 850 to 1050 deg. C. to a thickness of 400 to 1000 nm. After the composite insulator mask is stripped, using hot phosphoric acid for the removal of the silicon nitride layer and a buffered hydrofluoric acid for the underlying thin silicon dioxide layer, a thin silicon dioxide of gate oxide is thermally grown in oxygen and steam ambient at temperature between about 800 to 1000 deg. C. to a thickness between about 5 to 30 nm. A polysilicon layer is intrinsically deposited using low-pressure chemical vapor deposition (LPCVD) processing at a temperature between about 500 to 700 deg. C. to a thickness between about 150 to 400 nm and then followed by doping the polysilicon layer with arsenic or phosphorus ion-implant at 50 to 150 KeV with a dose between about 1E15 to 1E16 ions/cm$^2$. Another alternative to the above approach, is to use the in-situ doping technique during the deposition of polysilicon. An annealing step is processed to activate the implanted ions in the polysilicon by either the conventional furnace annealing at temperatures between about 850 to 900 deg. C., or by the rapid thermal anneal (RTA) technique at temperatures between about 925 to 1000 deg. C. The conventional photolithographic and RIE procedures, using chlorine as an etchant, are used to define polysilicon gate structure, 26. After the removal of the photoresist via the standard plasma oxygen ashing and surface cleaning, the exposed source and drain region, 24 and 25, are doped slightly by ion-implantation of phosphorus at energy level between about 30 to 60 KeV with a dose between about 1E12 to 5E13 ions/cm$^3$. A low-temperature silicon oxide layer is next deposited, using either LPCVD or plasma enhanced chemical vapor deposition (PECVD) processing, at a temperature between about 500 to 800 deg. C., to a thickness between about 150 to 200 nm, using tetraethylorthosilicate (TEOS) as a source. An anisotropic RIE procedure, using CHF$_3$ as an etchant, forms oxide insulating sidewall spacer, 22, around the exposed sides of the polysilicon gate structure, 26. The source and drain regions which are now exposed after the anisotropic RIE procedure are next ion-implanted using arsenic at an energy between about 50 to 100 KeV, at a dose between about 1E14 to 5E15 ions/cm$^3$.

Figure 2:
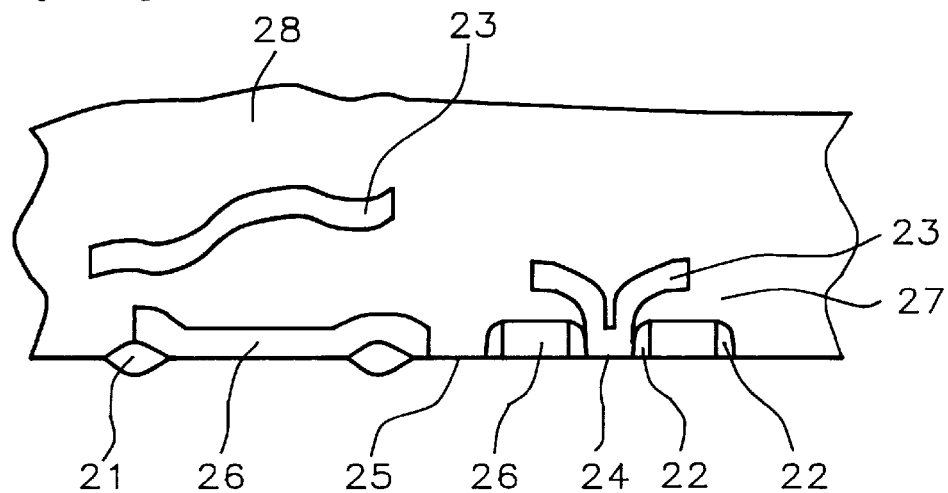
FIG. 2 is a schematic cross section of the semiconductor IC device at a subsequent stage of processing.

A thick layer of silicon oxide, 27, is deposited, using either LPCVD, PECVD or atmospheric pressure chemical vapor deposition (APCVD), at a temperature between 400 to 800 deg. C. to a thickness between about 500 to 1000 nm as shown in FIG. 2. Photolithographic and CHF$_3$ RIE etching are performed to expose the contact regions and a second polysilicon layer is deposited and doped either by ion-implantation or by in-situ doping during deposition. Another photolithographic and chlorine RIE steps are processed to define the polysilicon contact and connects 23. Another thick TEOS oxide, 28, is deposited conformally over the non-planar topographic surface of the wafer (FIG.2), using the same method as mentioned in the previous TEOS layer, 27, to a thickness between about 1000 to 1500 nm to be used for planarization.

Figure 3A:
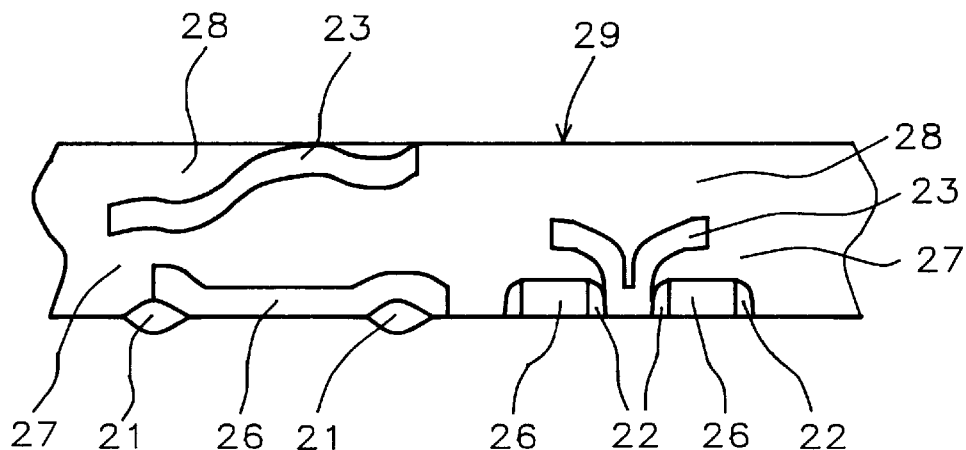
FIGS. 3a & 3b are the schematic cross sections of the semiconductor IC devices at high and low topographic sites on the wafer respectively, after planarization processing with chemical-mechanical polishing.
Figure 3B:
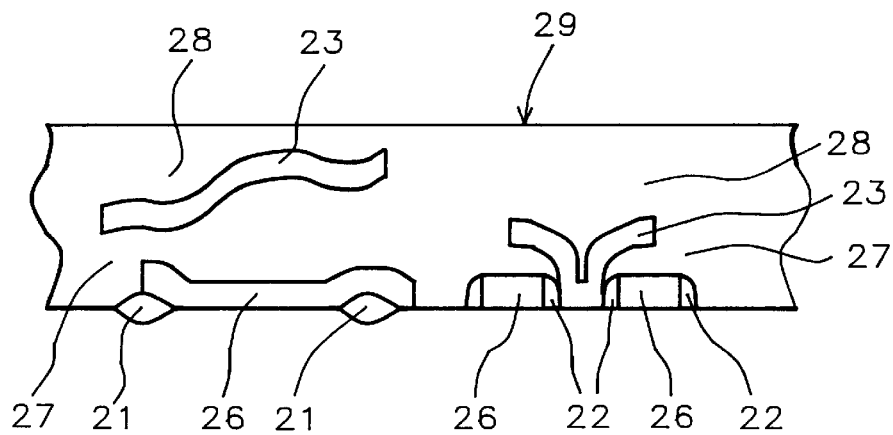

The wafer surface is then planarized by the chemical-mechanical polishing (CMP) process, which comprises of holding the wafer against a rotating wetted polishing pad surface under controlled pressure of about 7 to 10 PSI . A polishing slurry mixture of NH$_4$OH or KOH solution is used as a chemical etch component in the CMP process in combination with the mechanical polishing component such as alumina or silica grits of about 1000 A particle size. The flow rate of the CMP slurry is about 100 to 200 ml per minute. The carrier speed is about 10 to 70 RPM. The polishing platen is typically covered with polyurethane and rotates at a speed about 20 to 60 RPM. The polishing temperature of the CMP is between about 80 to 150 deg. F. Due to CMP process variables, such as slurry composition, pad compressibility, pressure, differential height of the wafer surface topography and variation of device density on the wafer, the resulting polished surface, 29, may still show exposure of the underlying polysilicon in some of the high topography area as shown in FIG. 3$a$, thereby, vulnerable to polysilicon-to-polysilicon shorts with the subsequent polysilicon layer, but the underlying polysilicon in low topography area is fully covered with TEOS oxide as shown schematically in FIG. 3$b$. This interconnect reliability exposure still exists even when extremely thick TEOS is used in an attempt to promote full planarization of the non-planar surface topography after CMP polishing.

Figure 4A:
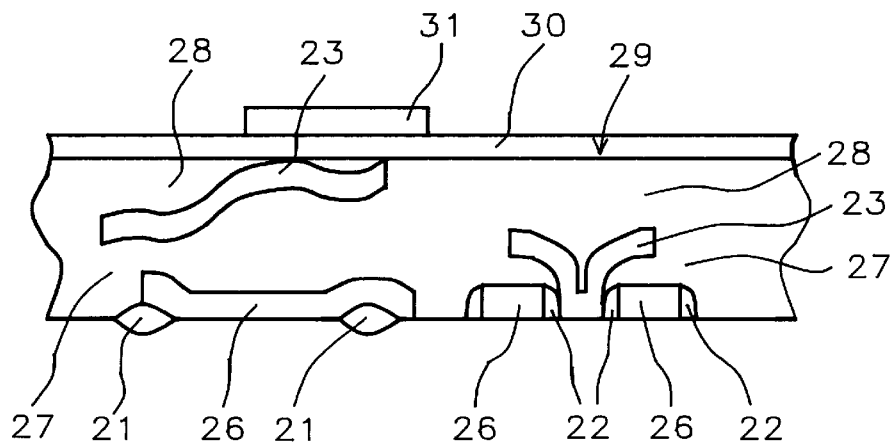
FIGS. 4a & 4b are the schematic cross sections of the IC devices at high and low topographic sites on the wafer with the additional insulating layer described in this invention to create a electrical barrier between the contact polysilicon that was exposed at high topographical sites and the subsequent polysilicon layer.
Figure 4B:
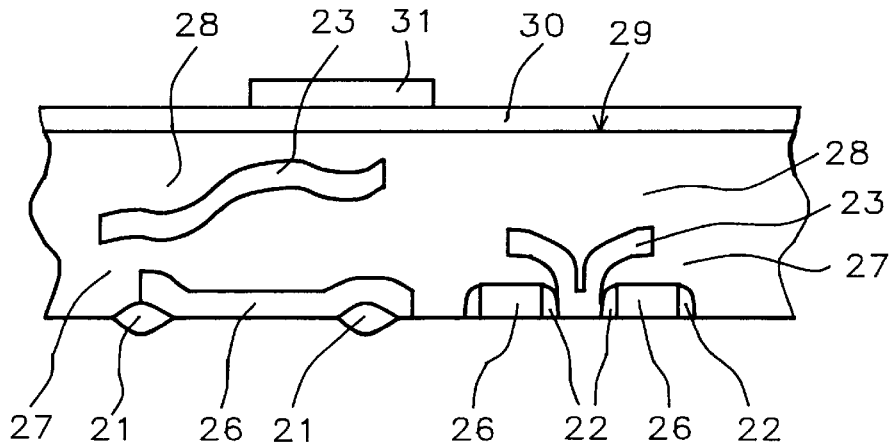

A second layer of insulating TEOS or oxide, 30, as shown in FIGS. 4$a$ & 4$b$, of thickness in the range of 50 and 100 nm is next deposited by the LPCVD, PECVD or APCVD method at temperature between 400 and 800 deg. C. The oxide deposition temperature should be low enough not to alter the doping profiles of the underlying device components and the thickness of this oxide has to be thick enough to protect the underlying polysilicon and to prevent undesirable parasitic characteristics.

After the deposition of this oxide layer another polysilicon layer, 31, is either intrinsically deposited or deposited with in-situ dopant POCl$_3$ using the LPCVD processing, at a temperature between about 560 to 580 deg. C. for the next level interconnect in the multi-level interconnect of the chip design. In the former deposition, dopants, such as phosphorus, boron, etc. are implanted at energy between about 30 to 40 KeV with a dose in the range of $1 \times 10^{12}$ to $1 \times 10^{15}$ ions/cm$^2$ and followed by an activation anneal by rapid thermal anneal at temperature between about 920 to 950 deg. C. for about 20 to 30 seconds. Conventional photolithographic and RIE procedures, using chlorine gas as an etchant are used to create polysilicon patterns as shown in FIGS. 4$a$ & 4$b$.

Although the process described above shows a method to prevent shorts between interlevel polysilicon interconnects, it can also be applied to avoid interlevel metal-to-metal shorts as in the case of aluminum or tungsten metallization levels.

While particular embodiments, operational sequences, materials, etchants, etc. have been described or illustrated to set forth the principles of the invention , such are not intended to limit the invention to that described or illustrated. Modifications and changes will become apparent to those skilled in the art that various changes in form and details may be made without departing from the spirit and scope of this invention.,

What is claimed is:

1. A method for fabricating integrated circuits and to provide high reliability electrical isolation between adjacent levels of contacts and connections, comprising the steps of:

providing a semiconductor substrate;

depositing and patterning a non-planar highly doped polysilicon layer over said semiconductor substrate;

depositing a first insulating layer over said highly doped polysilicon and over said substrate, whereby said first insulating layer has a non-planar surface; then chemical-mechanical polishing of said non-planar surface for planarization using a polishing slurry, whereby portions of said highly doped polysilicon are exposed;

depositing an additional insulating layer over said substrate to cover any exposed portions of said highly doped polysilicon; and depositing an additional polysilicon layer over said substrate, for interconnects and devices.

2. The method of claim 1 wherein said additional insulating layer is TEOS, deposited at a temperature between about 400 to 800 deg. C. by using either LPCVD, PECVD or APCVD processing to a thickness between about 50 to 100 nm.

3. The method of claim 1 wherein said additional insulating layer is borophosphosilicate glass (BPSG) or a combination of BPSG and TEOS.

4. The method of claim 1, wherein said first insulating layer is planarized by chemical mechanical polishing (CMP) by holding said non-planar surface against a rotating wetted polishing pad surface under controlled pressure of about 7 to 10 PSI.

5. The method of claim 1, wherein said polishing slurry used in said CMP consists of a chemical solution of $NH_4OH$ and KOH in combination with a mechanical polishing component of alumina or silica grits of particle size between about 900 A to 1100 A, at a flow rate of about 100 to 200 ml per minute, and at a polishing temperature about 80 to 150 deg. F.

6. The method of claim 1, wherein said substrate is rotated during said chemical mechanical polishing process at a speed of between about 10 to 70 RPM.

7. A method for preventing exposure of polysilicon layers in a multi-polysilicon structure during chemical mechanical polishing, comprising the steps of:

providing a semiconductor substrate having at least one polysilicon layer deposited thereon, and having a non-planar surface topography;

depositing an insulating layer over said substrate; then chemical-mechanical polishing said non-planar surface topography whereby portions of underlying polysilicon layers are exposed;

depositing an additional insulating layer over said substrate to cover any exposed portion of said underlying polysilicon layer, and depositing an additional polysilicon layer over said substrate, whereby said additional insulating layer prevents shorts between said additional and said underlying polysilicon layers.

8. The method of claim 7 wherein said additional insulating layer is TEOS, deposited at a temperature between about 400 to 800 deg. C. by using either LPCVD, PECVD or APCVD processing to a thickness between about 50 to 100 nm.

9. The method of claim 7, wherein said additional insulating layer is borophosphosilicate glass (BPSG) or a combination of BPSG and TEOS.

10. The method of claim 7, wherein a polishing slurry used in said step of chemical mechanical polishing consists of a chemical solution of $NH_4OH$ and KOH in combination with a mechanical polishing component of alumina or silica grits of particle size between about 900 A to 1100 A, at a flow rate of about 100 to 200 ml per minute, and at a polishing temperature about 80 to 150 deg. F.

11. The method of claim 7, wherein said substrate is rotated during said chemical mechanical polishing at a speed of between about 10 to 70 RPM.

* * * * *